United States Patent
Shen et al.

(10) Patent No.: US 8,368,338 B2
(45) Date of Patent: Feb. 5, 2013

(54) DEVICE AND METHOD FOR DETECTING TYPE OF FAN

(75) Inventors: Wei-Kai Shen, Taipei (TW); Kuan-Yin Lin, Taipei (TW)

(73) Assignee: Pegatron Corporation, Taipei (TW)

( * ) Notice: Subject to any disclaimer, the term of this patent is extended or adjusted under 35 U.S.C. 154(b) by 323 days.

(21) Appl. No.: 12/961,552

(22) Filed: Dec. 7, 2010

(65) Prior Publication Data

US 2011/0156630 A1 Jun. 30, 2011

(30) Foreign Application Priority Data

Dec. 24, 2009 (TW) .............................. 98144677 A

(51) Int. Cl.
*H02K 11/00* (2006.01)

(52) U.S. Cl. ........ 318/490; 318/473; 318/471; 318/599; 318/671

(58) Field of Classification Search ................... 318/490, 318/473, 471, 599, 671
See application file for complete search history.

(56) References Cited

U.S. PATENT DOCUMENTS

| 7,313,466 B2 | 12/2007 | Chang |
| 7,425,812 B2 * | 9/2008 | Goldberg ...................... 318/610 |
| 7,791,301 B2 * | 9/2010 | Huang et al. .................. 318/473 |
| 2009/0169188 A1 | 7/2009 | Huang et al. |

FOREIGN PATENT DOCUMENTS

CN 2864764 1/2007

OTHER PUBLICATIONS

English translation of abstract of CN 2864764.

* cited by examiner

*Primary Examiner* — Walter Benson
*Assistant Examiner* — David Luo
(74) *Attorney, Agent, or Firm* — McClure, Qualey & Rodack, LLP

(57) ABSTRACT

This invention provides a device and method for detecting a type of a fan. The device for detecting a type of a fan includes a detector and a voltage controller. The detector is used for detecting and comparing a control voltage with a reference voltage to generate a comparison signal and transmitting the comparison signal to the voltage controller. The voltage controller outputs a variable voltage or a constant voltage to a voltage input terminal of a fan according to the comparison signal. The voltage controller can include an integrator for integrating a modulation signal and outputting the variable voltage.

20 Claims, 4 Drawing Sheets

DEVICE AND METHOD FOR DETECTING TYPE OF FAN

CROSS-REFERENCE TO RELATED APPLICATIONS

This Non-provisional application claims priority under 35 U.S.C. §119(a) on Patent Application No(s). 098144677 filed in Taiwan, Republic of China on Dec. 24, 2009, the entire contents of which are hereby incorporated by reference.

BACKGROUND OF THE INVENTION

1. Field of the Invention

This invention relates to a hardware control circuit and, more particularly, to a device and method for detecting a type of a fan.

2. Description of the Related Art

According to a heat dissipating design of an electronic product, a fan is mostly used to guide airflow and to dissipate heat. Usually, there are two types of a small fan. The first type is a three-pin fan which changes a rotating speed thereof via a direct-current (DC) voltage; the other type is a four-pin fan which includes one with built-in rising resistors and one without rising resistors. The four-pin fan controls a rotating speed thereof via a pulse width modulation (PWM) signal.

According to the prior art of detecting a type of a fan, for example, in a U.S. application publication No. 20090169188 titled "APPARATUS AND METHOD FOR FAN AUTO-DETECTION", software and hardware are used to detect a type of a fan and to control a rotating speed of the fan. In detail, a voltage of the fan is determined to generate a control signal and thus the control signal is transmitted to a PWM generator and a DC adjustor. Further, a rotating speed of the fan is detected. That is, whether the rotating speed of the fan changes with the signal of the PWM generator is detected. In a Chinese patent No. 2864764 titled "DEVICE FOR CONTROLLING DRIVING FAN", an identification code of a fan is used to detect a type of the fan. In detail, a fan type identification module transmits protocol data, and after the fan receives the protocol data, the fan transmits an identification code to a driving signal setting module to inform the driving signal setting module of the type of the fan. During determination of the type of the fan, since the fan type identification module needs to transmit the protocol data to the fan, a controller capable of transmitting the protocol data needs to be built in the fan, thereby expending extra cost. In a U.S. Pat. No. 7,313,466 titled "SYSTEM AND METHOD FOR AUTOMATICALLY DETECTING A TYPE OF A CPU FAN", software is used to detect a type of a fan. In detail, a PWM signal is controlled by the software, and a change of a rotating speed of the fan is determined by adjusting the PWM signal. However, only a rotating speed of a four-pin fan changes according to a PWM signal.

BRIEF SUMMARY OF THE INVENTION

To effectively detect a type of a fan and control a rotating speed of the fan, one embodiment of this invention provides a device for detecting a type of a fan. The device is connected with a fan having a voltage input terminal and includes a detector and a voltage controller. The detector is used for detecting a control voltage of the voltage input terminal and comparing the control voltage with a reference voltage to generate a comparison signal. The voltage controller receives a modulation signal, a constant voltage, and the comparison signal. When the control voltage is smaller than the reference voltage, the voltage controller converts the modulation signal to a variable voltage and outputs the variable voltage to the voltage input terminal of the fan. When the control voltage is greater than the reference voltage, the voltage controller outputs the constant voltage to the voltage input terminal of the fan.

The embodiment of this invention provides a method for detecting a type of a fan. The method includes the following steps. A control voltage of a voltage input terminal of a fan is detected. The control voltage is compared with a reference voltage. When the control voltage is smaller than the reference voltage, a modulation signal is converted to a variable voltage and the variable voltage is outputted to the voltage input terminal of the fan; when the control voltage is greater than the reference voltage, a constant voltage is outputted to the voltage input terminal of the fan.

These and other features, aspects, and advantages of the present invention will become better understood with regard to the following description, appended claims, and accompanying drawings.

DETAILED DESCRIPTION OF THE INVENTION

According to a device for detecting a type of a fan in one embodiment, a type of a fan is determined by hardware. The advantages of using the hardware are that a software controller is omitted and loads of a system can be reduced. For example, when the computer is booted, a basic input/output system (BIOS) controls input/output devices of the computer, such as a computer fan system. The BIOS needs a large amount of time to determine the type of the fan. If the hardware can directly determine the type of the fan, the loads of the BIOS are reduced.

Figure 1:
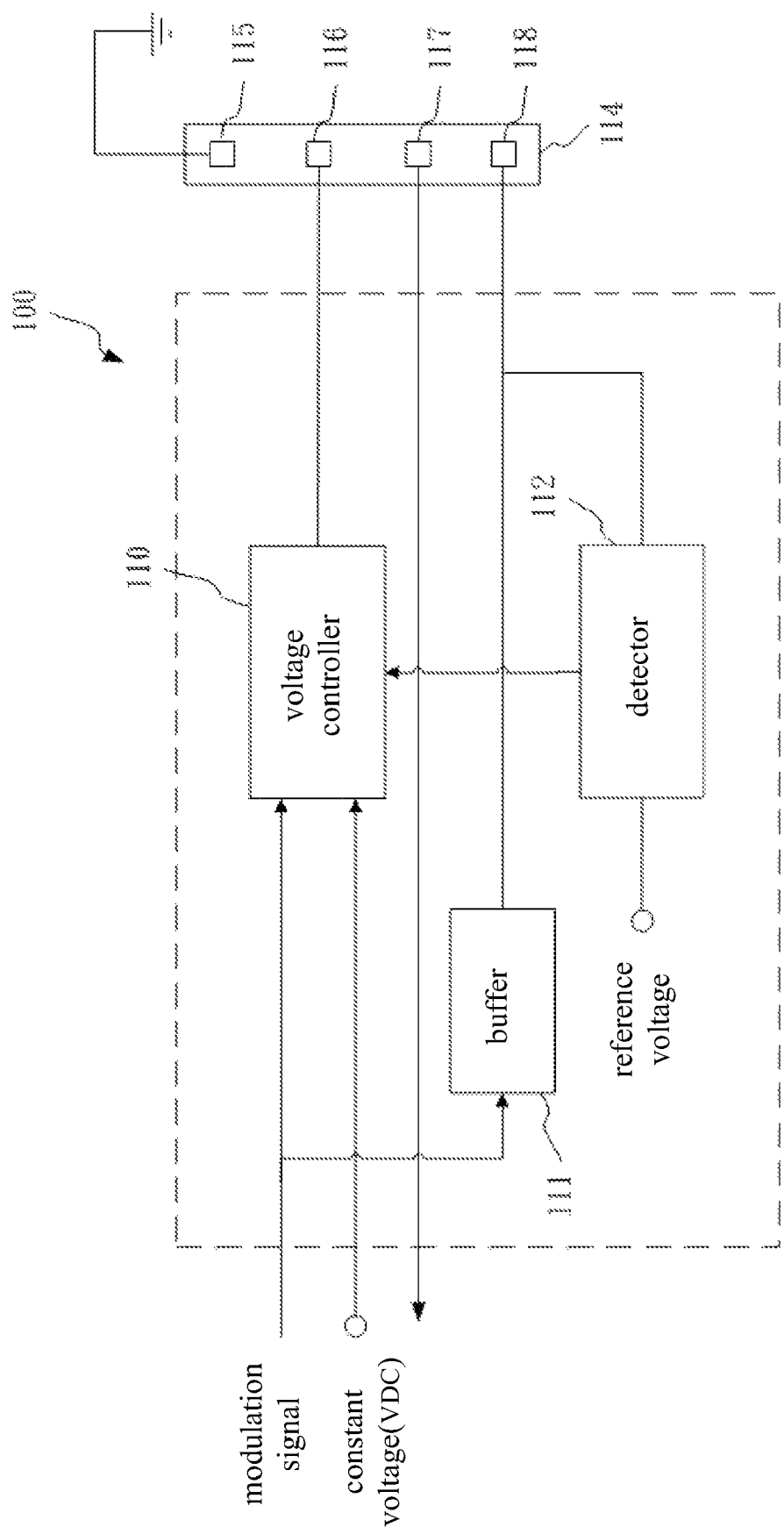
FIG. 1 is a block diagram showing a device for detecting a type of a fan according to one embodiment of the invention.

FIG. 1 is a block diagram showing a device for detecting a type of a fan according to one embodiment of the invention. A device for detecting a type of a fan 100 includes a voltage controller 110, a buffer 111, and a detector 112. The connection relation and functions of the elements are described hereinbelow. The detector 112 is used for detecting a voltage of a pulse width modulation (PWM) control pin, i.e. called control voltage hereinbelow, and compares the control voltage with a reference voltage to generate a comparison signal. The voltage controller 110 is used for receiving a PWM signal, i.e. modulation signal hereinbelow, a constant voltage VDC, and the comparison signal. When the control voltage is smaller than the reference voltage, the voltage controller 110 converts the modulation signal to a variable voltage and outputs the variable voltage to a voltage input terminal, i.e. a second pin, of the fan. When the control voltage is greater than the reference voltage, the voltage controller 110 outputs the constant voltage VDC to the voltage input terminal of the fan. The buffer 111 is not only used for buffering the modulation signal but also isolating the modulated signal results in error detection on detector. The reference voltage is between 0.1 V and 0.3 V, and it may be 0.15 V in one embodiment.

A connector 114 has four pins. A first pin 115 is a ground terminal; a second pin 116 is the voltage input terminal. A third pin 117 is a rotating speed signal output terminal. A fourth pin 118 is a PWM control signal terminal. A voltage of the fourth pin 118 is the control voltage, and a signal outputted from the third pin 117 is a rotating speed signal and is directly transmitted to a control chip terminal of the fan to show the rotation speed. The device for detecting a type of a fan 100 uses the detector 112 to detect the control voltage of the fourth pin 118 compared with the reference voltage thus to generate the comparison signal to determine whether the fan is a three-pin or a four-pin fan. The three-pin fan includes the following pins. A first pin is a ground terminal A second pin is a voltage input terminal which will determine the speed of the fan. A third pin is a rotating speed signal output terminal The four-pin fan includes the following pins. A first pin is a ground terminal; a second pin is a voltage input terminal; a third pin is a rotating speed signal output terminal. Additionally, a fourth pin is a PWM control signal terminal.

Therefore, when the three-pin fan is connected with the connector 114, since the three-pin fan does not include a fourth pin, the fourth pin 118 of the connector 114 is floated to allow the control voltage to be in a low level (approaching zero potential), and the control voltage is smaller than the reference voltage. Therefore, the device for detecting a type of a fan 100 can determine that the fan is a three-pin fan according to the comparison signal. At that moment, the voltage controller 110 can convert the modulation signal to the variable voltage and output the variable voltage to the voltage input terminal of the fan via the second pin 116 of the connector 114 thus to control a rotating speed of the fan. When the four-pin fan is connected with the connector 114, the fourth pin 118 of the connector 114 is connected with the fourth pin of the fan to allow the control voltage to be in a high level (pulled high resistor is inherent in four-pin fan itself), and the control voltage is greater than the reference voltage. Therefore, the device for detecting a type of a fan 100 can determine that the fan is a four-pin fan. At that moment, the voltage controller 110 can output the constant voltage VDC to the voltage input terminal of the fan via the second pin 116 of the connector 114, and after the buffer 111 buffers the modulation signal, a PWM control signal is outputted to the fan to control a rotating speed of the fan via the fourth pin.

Two embodiments of the voltage controller 110 are described hereinbelow.

Figure 2:
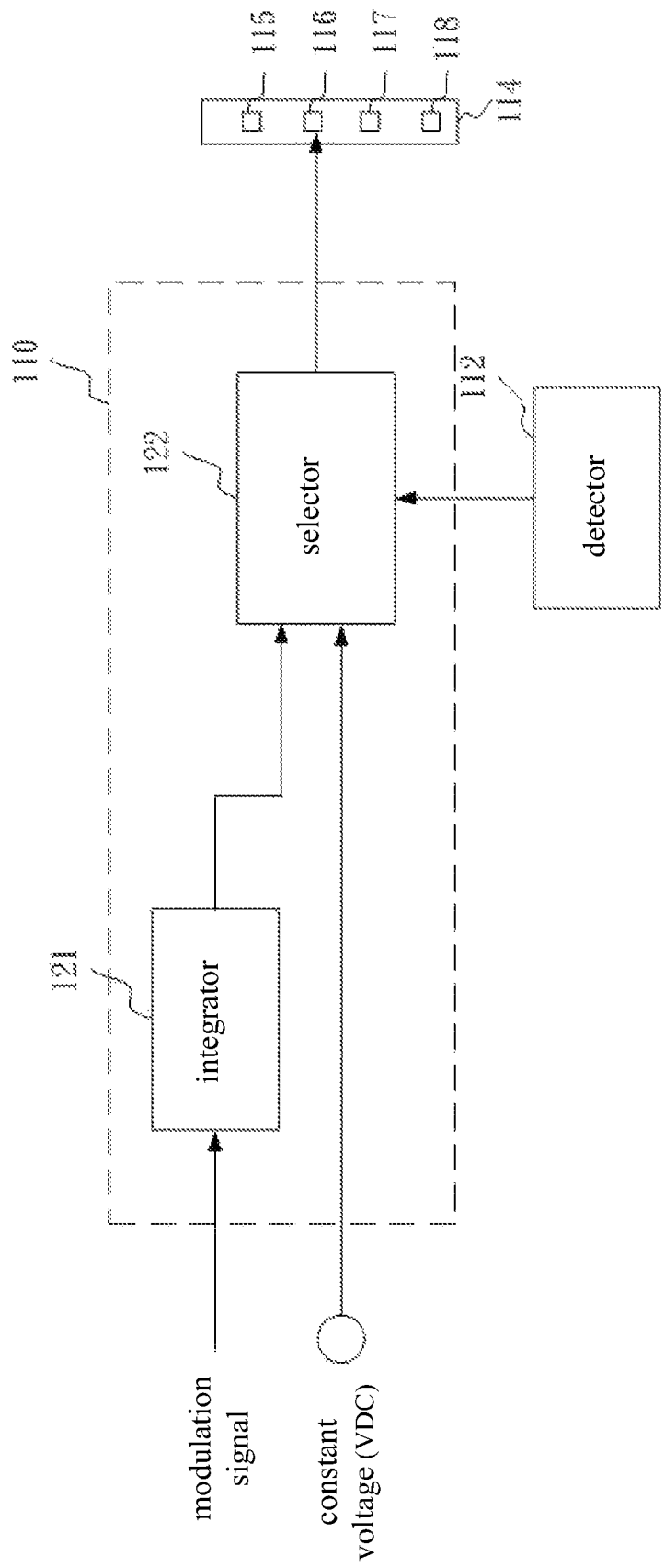
FIG. 2 is a block diagram showing a voltage controller according to one embodiment of the invention.

Then, FIG. 2 is a block diagram showing a voltage controller 110 according to one embodiment of the invention. The voltage controller 110 includes an integrator 121 and a selector 122. The integrator 121 is used for receiving a modulation signal and integrating the modulation signal into a variable voltage. The selector 122 is used for receiving a constant voltage VDC, the variable voltage, and a comparison signal. When the control voltage is smaller than a reference voltage, the selector 122 outputs the variable voltage to a voltage input terminal i.e. a second pin, of the fan. When the control voltage is greater than the reference voltage, the selector 122 outputs the constant voltage VDC to the voltage input terminal, i.e. the second pin, of the fan. The integrator 121 is selected from a RC integrator and an OPA negative feedback integrator. The selector 122 can be the switch such as an analog switching device.

Figure 3:
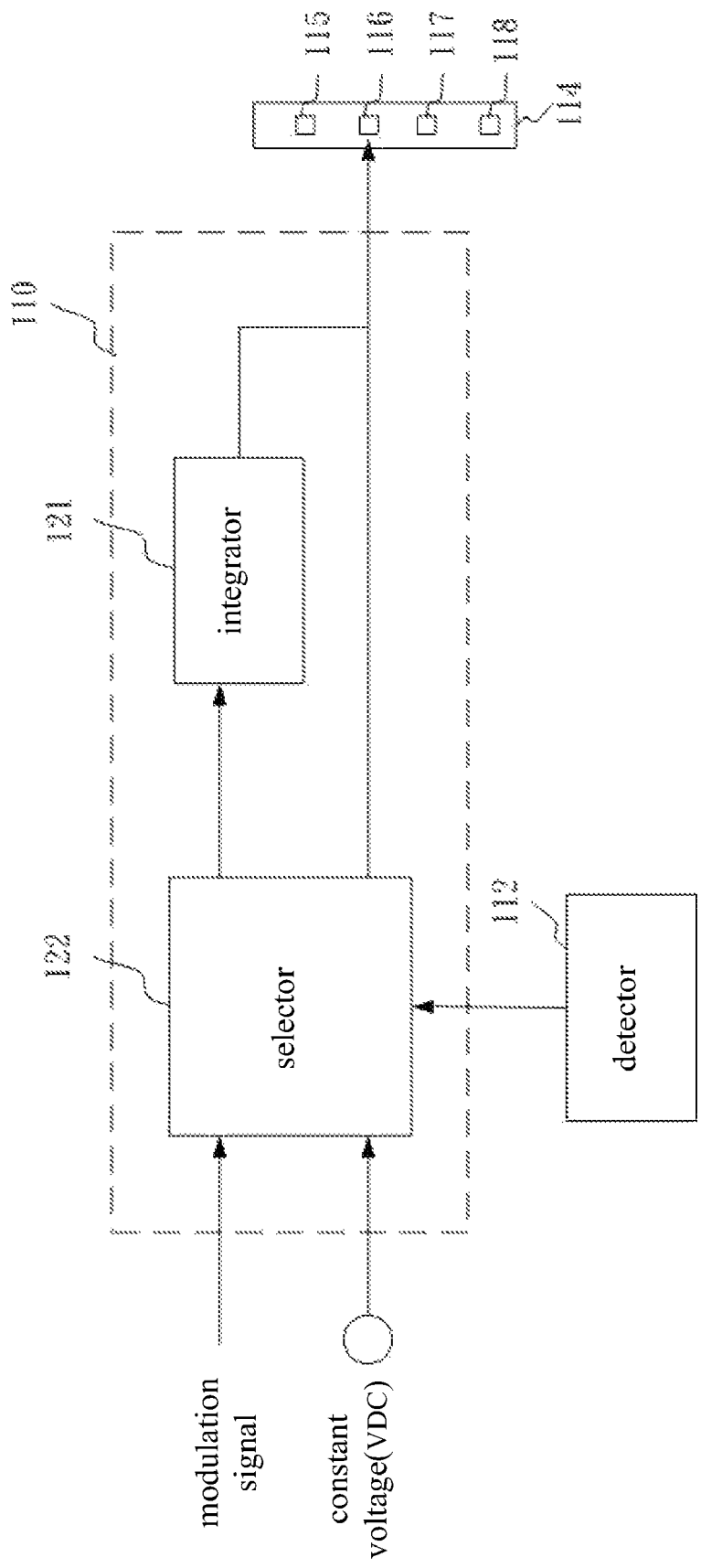
FIG. 3 is a block diagram showing a voltage controller according to another embodiment of the invention.

Then, FIG. 3 is a block diagram showing a voltage controller 110 according to another embodiment of the invention. The voltage controller 110 includes an integrator 121 and a selector 122. The selector 122 is used for receiving a constant voltage VDC and a modulation signal. When the control voltage is smaller than a reference voltage, the selector 122 outputs the modulation signal. When the control voltage is greater than the reference voltage, the selector 122 outputs the constant voltage VDC. That is, via the selection of the selector 122, it can be determined that which one of the modulation signal and the constant voltage VDC should be outputted. The integrator 121 is connected with the selector 122 and a voltage input terminal of the fan. After receiving the modulation signal, the integrator 121 integrates the modulation signal into the variable voltage.

Figure 4:
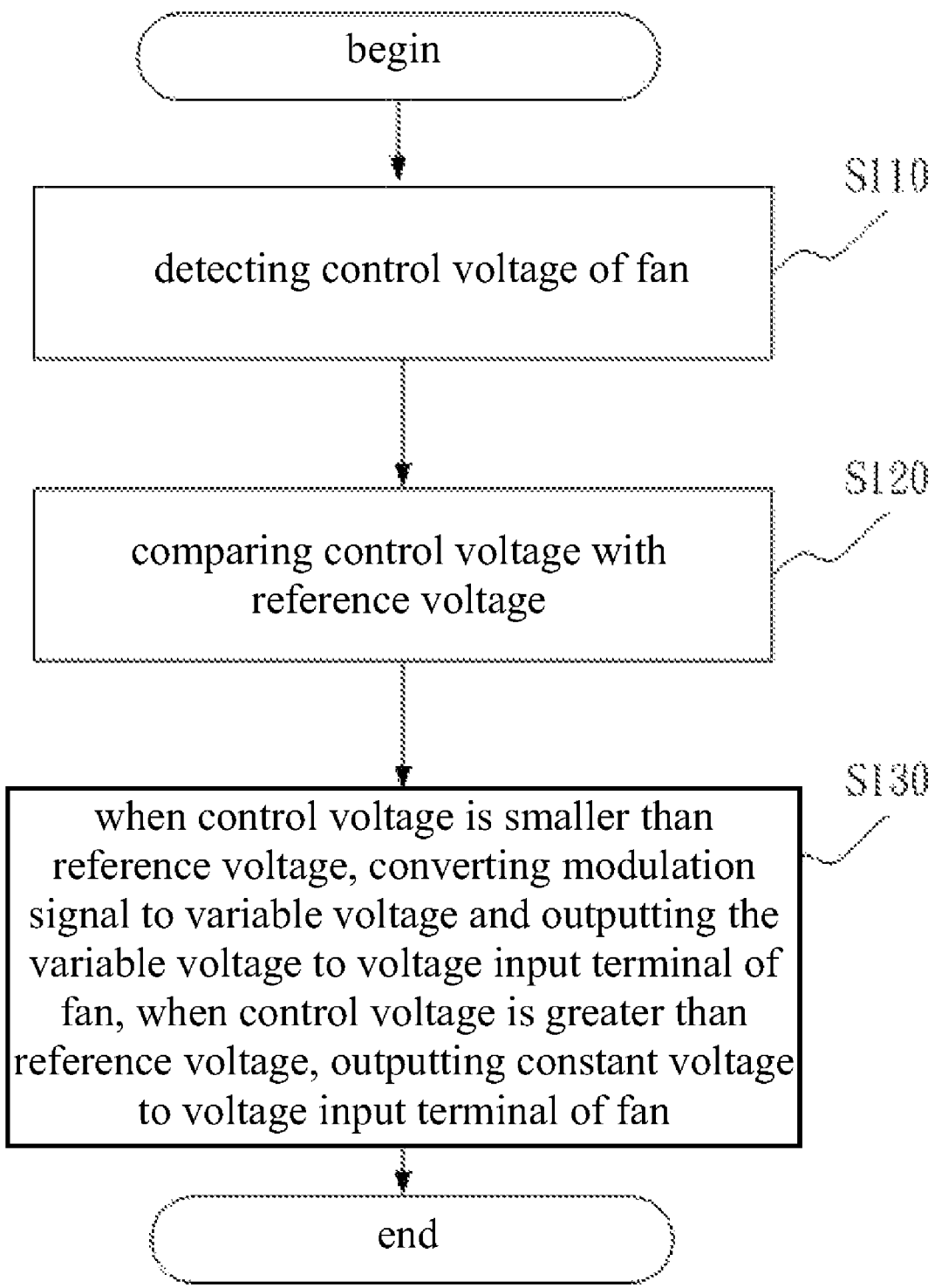
FIG. 4 is a flowchart showing a method for detecting a type of a fan according to one embodiment of the invention.

Then, FIG. 4 is a flowchart showing a method for detecting a type of a fan according to one embodiment of the invention. The method includes the following steps.

Step S110: a control voltage of a fan is detected.

Step S120: the control voltage is compared with a reference voltage. The reference voltage is between 0.1 V and 0.3 V. In one embodiment, the reference voltage may be 0.15 V.

Step S130: when the control voltage is smaller than the reference voltage, a modulation signal is converted to a variable voltage and the variable voltage is outputted to a voltage input terminal of the fan; when the control voltage is greater than the reference voltage, a constant voltage is outputted to the voltage input terminal of the fan.

The step of converting the modulation signal to the variable voltage is that the modulation signal is integrated into the variable voltage.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A device for detecting a type of a fan connected with a fan having a voltage input terminal, the device comprising:
    a detector for detecting a control voltage of the voltage input terminal and comparing the control voltage with a reference voltage to generate a comparison signal; and
    a voltage controller receiving a modulation signal, a constant voltage, and the comparison signal, wherein when the control voltage is smaller than the reference voltage, the voltage controller converting the modulation signal to a variable voltage and outputting the variable voltage to the voltage input terminal of the fan, when the control voltage is greater than the reference voltage, the voltage controller outputting the constant voltage to the voltage input terminal of the fan, wherein the voltage controller further comprises:
    a selector for receiving the constant voltage and the modulation signal, wherein when the control voltage is smaller than the reference voltage, the selector outputting the modulation signal, when the control voltage is greater than the reference voltage, the selector outputting the constant voltage to the voltage input terminal of the fan; and
    an integrator connected with the selector and the fan for receiving and integrating the modulation signal into the variable voltage and outputting the variable voltage to the voltage input terminal of the fan.

2. The device for detecting a type of a fan according to claim 1, wherein when the fan is a three-pin fan, the control voltage is smaller than the reference voltage.

3. The device for detecting a type of a fan according to claim 1, wherein when the fan is a four-pin fan, the control voltage is greater than the reference voltage.

4. The device for detecting a type of a fan according to claim 1, wherein the control voltage is a voltage of a pulse width modulation control pin of the voltage input terminal.

5. The device for detecting a type of a fan according to claim 1, wherein the modulation signal is a pulse width modulation signal.

6. The device for detecting a type of a fan according to claim 1, further comprising:
   a buffer connected with the detector for buffering the modulation signal.

7. The device for detecting a type of a fan according to claim 1, wherein the voltage controller comprises:
   an integrator for receiving the modulation signal and integrating the modulation signal into the variable voltage; and
   a selector for receiving the constant voltage, the variable voltage, and the comparison signal, when the control voltage is smaller than the reference voltage, the selector outputting the variable voltage to the voltage input terminal of the fan, when the control voltage is greater than the reference voltage, the selector outputting the constant voltage to the voltage input terminal of the fan.

8. The device for detecting a type of a fan according to claim 7, wherein the integrator is selected from a RC integrator and an OPA negative feedback integrator.

9. The device for detecting a type of a fan according to claim 7, wherein the selector is an analog switching device.

10. The device for detecting a type of a fan according to claim 1, wherein the integrator is selected from a RC integrator and an OPA negative feedback integrator.

11. The device for detecting a type of a fan according to claim 1, wherein the selector is an analog switching device.

12. The device for detecting a type of a fan according to claim 1, wherein the reference voltage is between 0.1 V and 0.3 V.

13. The device for detecting a type of a fan according to claim 1, wherein the detector is a comparator.

14. A method for detecting a type of a fan comprising the following steps of:
   receiving a constant voltage and a modulation signal from a selector;
   detecting a control voltage of a voltage input terminal of a fan;
   comparing the control voltage with a reference voltage; and
   an integrator is connected with the selector; when the control voltage is smaller than the reference voltage, integrating a modulation signal to a variable voltage and outputting the variable voltage to the voltage input terminal of the fan, when the control voltage is greater than the reference voltage, outputting a constant voltage to the voltage input terminal of the fan.

15. The method for detecting a type of a fan according to claim 14, wherein the reference voltage is between 0.1 V and 0.3 V.

16. The method for detecting a type of a fan according to claim 14, wherein in the step of converting the modulation signal to the variable voltage, the modulation signal is a PWM signal, and the PWM signal is integrated into the variable voltage.

17. The method for detecting a type of a fan according to claim 14, wherein when the fan is a three-pin fan, the control voltage is smaller than the reference voltage.

18. The method for detecting a type of a fan according to claim 14, wherein when the fan is a four-pin fan, the control voltage is greater than the reference voltage.

19. The method for detecting a type of a fan according to claim 14, wherein the control voltage is a voltage of a pulse width modulation control pin of the voltage input terminal.

20. The method for detecting a type of a fan according to claim 14, wherein the modulation signal is a pulse width modulation signal.

* * * * *